(12) United States Patent
Wuu et al.

(10) Patent No.: US 11,710,698 B2
(45) Date of Patent: Jul. 25, 2023

(54) DUAL-TRACK BITLINE SCHEME FOR 6T SRAM CELLS

(71) Applicant: Advanced Micro Devices, Inc., Santa Clara, CA (US)

(72) Inventors: John J. Wuu, Fort Collins, CO (US); Richard T. Schultz, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/030,821

(22) Filed: Sep. 24, 2020

(65) Prior Publication Data

US 2022/0093503 A1  Mar. 24, 2022

(51) Int. Cl.
| | | |
|---|---|---|
| *H01L 23/528* | (2006.01) | |
| *H01L 27/11* | (2006.01) | |
| *H01L 23/522* | (2006.01) | |
| *H01L 29/786* | (2006.01) | |
| *H01L 29/06* | (2006.01) | |
| *H01L 29/423* | (2006.01) | |
| *G11C 11/418* | (2006.01) | |
| *G11C 11/419* | (2006.01) | |
| *H10B 10/00* | (2023.01) | |

(52) U.S. Cl.
CPC ......... *H01L 23/528* (2013.01); *G11C 11/418* (2013.01); *G11C 11/419* (2013.01); *H01L 23/5226* (2013.01); *H01L 29/0673* (2013.01); *H01L 29/42392* (2013.01); *H01L 29/78696* (2013.01); *H10B 10/125* (2023.02); *H10B 10/18* (2023.02)

(58) Field of Classification Search
CPC ............... H01L 23/528; H01L 23/5226; H01L 27/1108; H01L 27/1116; H01L 27/0207; H01L 27/1104; H01L 29/0673; H01L 29/42392; H01L 29/78696; G01C 11/418; G01C 11/419
USPC ...................................................... 257/351
See application file for complete search history.

(56) References Cited

U.S. PATENT DOCUMENTS

| | | | |
|---|---|---|---|
| 4,208,726 | A | 6/1980 | McElroy |
| 5,815,428 | A | 9/1998 | Tsuruda et al. |
| 5,917,224 | A | 6/1999 | Zangara |
| 6,151,244 | A * | 11/2000 | Fujino .................. G11C 11/401 365/230.03 |
| 6,549,987 | B1 | 4/2003 | Rappoport et al. |
| 6,618,282 | B1 | 9/2003 | Poplevine et al. |
| 6,826,070 | B2 | 11/2004 | Sung et al. |
| 7,009,880 | B1 | 3/2006 | Liu |
| 8,134,870 | B2 | 3/2012 | Alami et al. |
| 8,645,893 | B1 | 2/2014 | Yeung et al. |

(Continued)

OTHER PUBLICATIONS

Notice of Allowance in U.S. Appl. No. 17/030,830, dated May 4, 2022, 8 pages.

*Primary Examiner* — Dao H Nguyen
(74) *Attorney, Agent, or Firm* — Kowert, Hood, Munyon, Rankin & Goetzel, P.C.; Rory D. Rankin

(57) ABSTRACT

A layout for a 6T SRAM cell array is disclosed. The layout doubles the number of bits per bit cell in the array by implementing dual pairs of bitlines spanning bit cell columns in the array. Alternating connections (e.g., alternating vias) may be provided for wordline access to the bitlines in the layout. Alternating the connections may reduce RC delay in the layout.

20 Claims, 14 Drawing Sheets

(56) References Cited

U.S. PATENT DOCUMENTS

| | | |
|---|---|---|
| 9,251,888 B1 | 2/2016 | Liaw |
| 9,275,721 B2 | 3/2016 | Chen et al. |
| 9,575,891 B2 | 2/2017 | Riley et al. |
| 9,898,568 B2 | 2/2018 | Srivastava et al. |
| 2002/0131291 A1* | 9/2002 | Kurjanowicz .... H01L 27/10882 365/69 |
| 2003/0021140 A1 | 1/2003 | Morihara et al. |
| 2004/0033670 A1 | 2/2004 | Yang et al. |
| 2006/0187702 A1* | 8/2006 | Jacquet .................. G11C 7/02 365/154 |
| 2012/0163064 A1 | 6/2012 | Jain |
| 2013/0083591 A1* | 4/2013 | Wuu .................... G11C 11/413 365/154 |
| 2015/0279453 A1 | 10/2015 | Fujiwara et al. |
| 2016/0093623 A1 | 3/2016 | Luan et al. |
| 2016/0163714 A1 | 6/2016 | Mojumder et al. |
| 2022/0093504 A1 | 3/2022 | Schultz et al. |

* cited by examiner

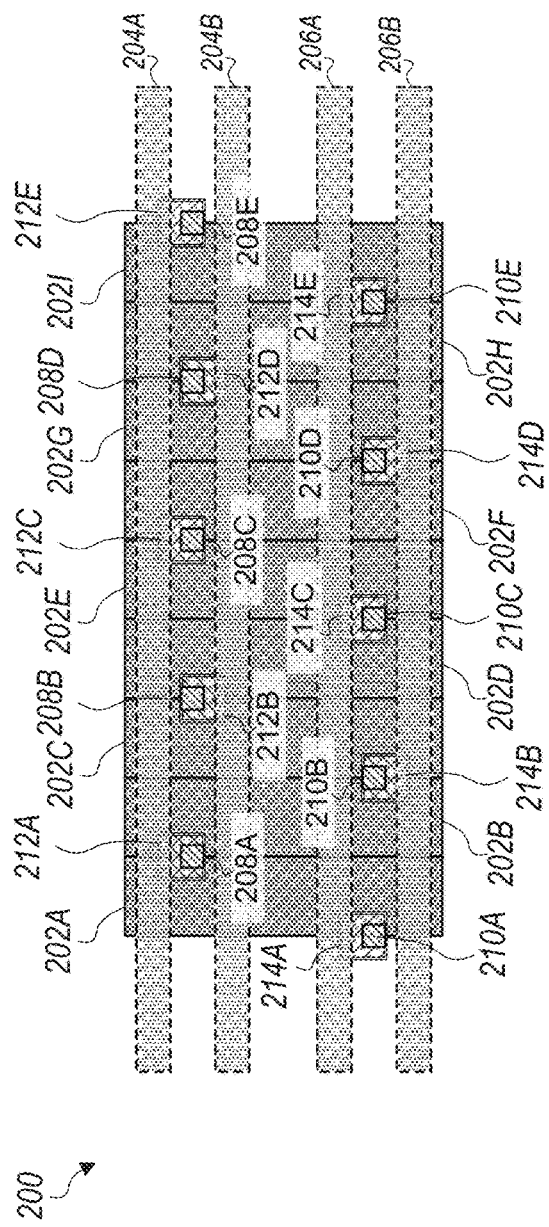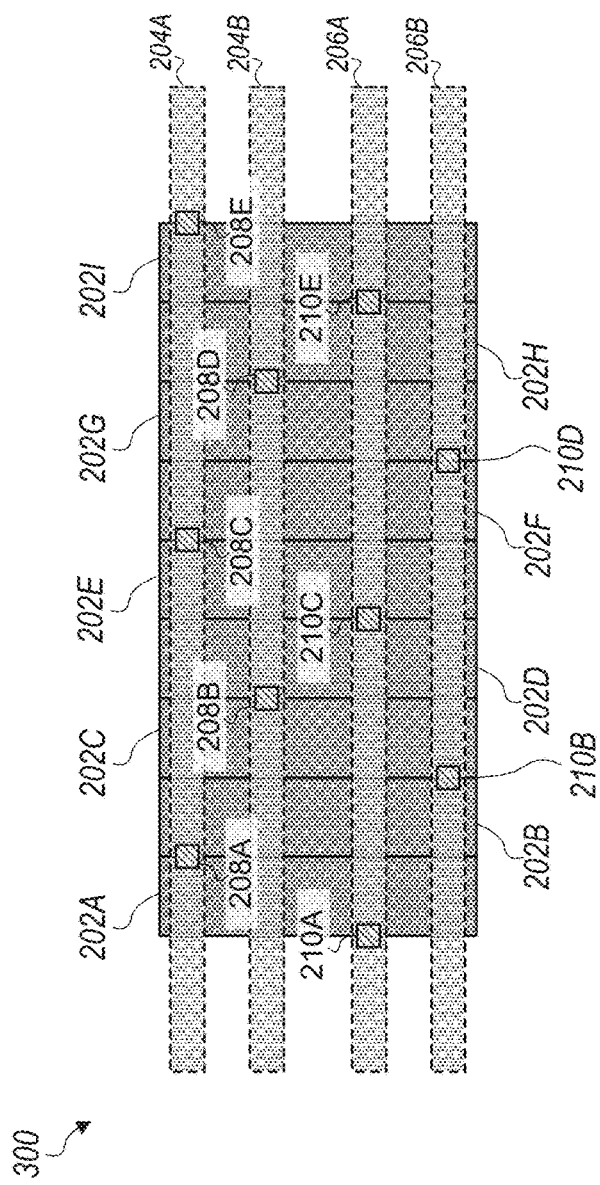

DUAL-TRACK BITLINE SCHEME FOR 6T SRAM CELLS

BACKGROUND

Description of the Related Art

As technology for SRAM ("static random-access memory") devices develops, many advanced technology SRAM devices (such as 6T SRAM cells) are implemented with unidirectional poly (polysilicon layers or metal layers). With the onset of the usage of unidirectional poly in SRAM devices, the cells (e.g. bit cells) have become increasingly taller and narrower (with an orientation of horizontal bitlines and vertical wordlines). FIG. 1 depicts a top view representation of an example of one prior art SRAM layout. SRAM layout 100 includes nine SRAM cells (e.g., bit cells) 102A-I (shown as columns in FIG. 1). Positive bitline 104A and negative bitline 104B run across (horizontally in the figure) the SRAM cells 102A-I in parallel. Bitline vias 106A-E are shared between neighboring cells 102A-I to provide access to positive bitline 104A. Bitline vias 108-A-E are shared between neighboring cells 102A-I to provide access to negative bitline 104B. As shown in FIG. 1, bitline vias 106A-E and bitline vias 108A-E alternate between neighboring cells (e.g., the vias are placed at every other interval in the 2-rows of vias).

One disadvantage of advanced technology SRAM cells is the skewed aspect ratio of the SRAM cells, as shown in FIG. 1. These taller and narrower SRAM cells may cause area inefficiencies at the tile or SoC ("system-on-chip") level. Another disadvantage is that restoring a squarer aspect ratio (e.g., by decreasing column mux (multiplexer) factor) to these SRAM cells is often not possible due to bit and bitline limitations from high bitline capacitance.

Yet another issue with advanced technology SRAM devices is that the resistances of metal used in the SRAM cells is getting worse (higher) due to, at least in part, the usage of lower level metals. The increased resistance of the metals causes an increase in RC delays for bitlines and wordlines in the SRAM cells. Reducing the resistance of the bitlines or wordlines (e.g., by reducing the distance of a wordline or bitline) may reduce RC delays and provide better performance in SRAM devices. Additionally, even for SRAM cell's with acceptable aspect (tall/narrow) ratios, reducing bitline capacitance may increase performance and reduce power consumption of the SRAM cell.

As described above, lowering the column mux factor may improve the aspect ratio for a SRAM cell. Lowering the column mux factor may, however, be limited due to unacceptably high bitline capacitance. In some instances, a "flying bitline" scheme has been attempted to reduce bitline capacitance. Implementing a flying bitline scheme, however, requires strapping the SRAM cell for bitline promotion, which costs area in the SRAM cell layout.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which:

FIG. 2 depicts a top view representation of an embodiment of a memory device layout.

FIG. 3 depicts a top view representation of another embodiment of a memory device layout.

DETAILED DESCRIPTION OF THE EMBODIMENTS

Figure 1:
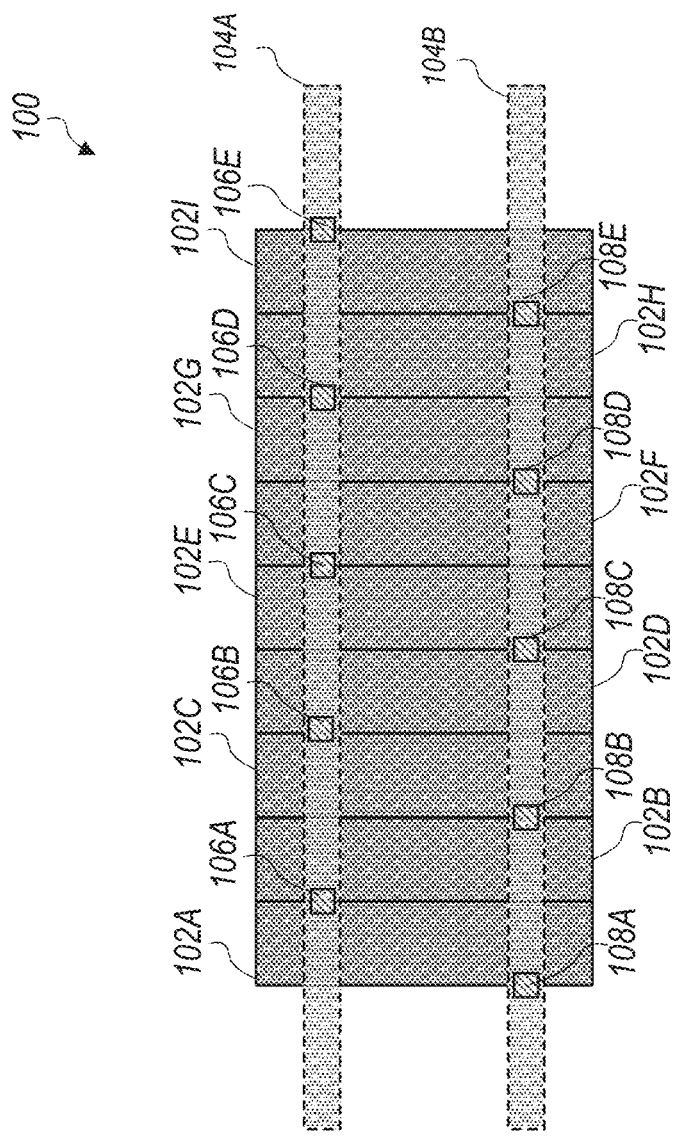
FIG. 1 depicts a top view representation of an example of one prior art memory device layout.

In the following description, numerous specific details are set forth to provide a thorough understanding of the methods and mechanisms presented herein. However, one having ordinary skill in the art should recognize that the various embodiments may be practiced without these specific details. In some instances, well-known structures, configurations, materials, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

FIG. 2 depicts a top view representation of an embodiment of memory device layout 200. Layout 200 may be, for example, a layout for a memory array. Layout 200 includes a plurality of bit cells 202 (e.g., bit cells 202A-I shown as columns in FIG. 2). In certain embodiments, bit cells 202 are 6T (six-transistor) SRAM cells. In the embodiment shown, layout 200 includes nine bit cells (e.g., bit cells 202A-I). The number of bit cells may, however, vary depending on the design and performance of a memory device associated with layout 200.

Bit cells 202 may be defined by an underlying layer of poly in layout 200. As used herein, the term "poly" may refer to polysilicon layers (e.g., used for polysilicon gates) or metal layers (e.g., multiple metal film layers used for metal gates). In some embodiments, the poly layer includes unidirectional polysilicon layers or unidirectional metal layers. For example, the poly may run (be oriented) in the vertical direction, as shown in FIG. 2. In certain embodiments, bit cells 202 are 2 poly-pitch bit cells (e.g., 2 vertical poly runs per bit cell in layout 200). The underlying layer of unidirectional poly may provide bit cells 202 with a pattern of n-channel to p-channel to p-channel to n-channel gates inside the bit cells in the vertical direction. In embodiments with the unidirectional poly and 2 poly-pitch bit cells, bit cells 202 may have heights (vertical heights of columns in FIG. 2) that are greater than widths (horizontal widths of columns in FIG. 2).

In certain embodiments, as shown in FIG. 2, layout 200 includes a first pair of bitlines 204A, B and a second pair of bitlines 206A, B that run (e.g., span) horizontally across bit cells 202. Two pairs of bitlines 204, 206 are possible in layout 200 because of the height (e.g. column pitch) of bit cells 202 in the layout. First pair of bitlines 204A, B and second pair of bitlines 206A, B may be oriented in parallel. Thus, layout 200 may include two pairs of parallel bitlines (first pair of bitlines 204A, B and second pair of bitlines 206A, B). In certain embodiments, bitlines 204A, B are positive bitlines and bitlines 206A, B are negative bitlines (e.g., bitlines 206A, B are complementary to bitlines 204A, B).

In the embodiment shown, layout 200 includes bitline vias 208 and bitline vias 210. Vias 208 and vias 210 may provide connections for wordlines, as described herein, to access bitlines 204A, 204B and bitlines 206A, 206B. Vias 208 and vias 210 may be positioned in layout 200 similar to the position of vias 106 and vias 108, respectively, in layout 100 (shown in FIG. 1). As shown in FIG. 2, vias 208 and vias 210 alternate between neighboring cells (e.g., the vias are placed at every other interval in the 2-rows of vias similar to layout 100, shown in FIG. 1). Thus, vias 208 and vias 210 may not need to be realigned for a fabrication process to change layout 100 to layout 200. As shown in FIG. 2, bitline 204A and bitline 204B are placed on opposite sides of vias 208 (above and below in the depiction) and bitline 206A and bitline 206B are placed on opposite sides of vias 210. Thus, vias 208 are positioned between bitline 204A and bitline 204B and vias 210 are positioned between bitline 206A and bitline 206B in layout 200.

In certain embodiments, vias 208 (e.g., vias 208A-E) provide access points for wordlines to first pair of bitlines 204A, 204B and vias 210 (e.g., vias 210A-E) provide access points for wordlines to second pair of bitlines 206A, 206B. Coupling between vias 208 and bitlines 204A, 204B may be provided by contacts 212 (e.g., contacts 212A-E). As shown in FIG. 2, contacts 212 may alternately couple to bitline 204A or bitline 204B. For example, contacts 212A, 212C and 212E may couple to bitline 204A while contacts 212B and 212D couple to bitline 204B. With the alternate coupling provided by contacts 212, vias 208 (and positive wordline access points) are alternately coupled to bitlines 204A, 204B. Coupling between vias 210 and bitlines 206A, 206B may be provided by contacts 214 (e.g., contacts 214A-E). Contacts 214 (similar to contacts 212) may alternately couple to bitline 206A or bitline 206B and thus, vias 210 (and negative wordline access points) are alternately coupled to bitlines 206A, 206B.

FIG. 3 depicts a top view representation of an embodiment of memory device layout 300. Layout 300 may be, for example, a layout for a memory array. Layout 300 includes a plurality of bit cells 202 (e.g., bit cells 202A-I shown as columns in FIG. 3). In the embodiment shown in FIG. 3, bit cells 202, bitlines 204A, 204B, and bitlines 206A, 206B are substantially similar to bit cells 202, bitlines 204A, 204B, and bitlines 206A, 206B in layout 200, shown in FIG. 2. In layout 300, as shown in FIG. 3, vias 208 and vias 210 are positioned along bitlines 204A, 204B and bitlines 206A, 206B, respectively. Positioning vias 208 and vias 210 along bitlines 204A, 204B and bitlines 206A, 206B places the vias (and wordline access points) directly under the bitlines in layout 300. Coupling between vias 208 and vias 210 to bitlines 204A, 204B and bitlines 206A, 206B may then be made directly up and down in layout 300 (e.g., coupling from vias to bitlines is made coming out of the page as depicted in FIG. 3).

In certain embodiments, as shown in FIG. 3, vias 208 (and positive wordline access points) are alternately placed under bitline 204A or bitline 204B and the vias are coupled to the bitlines that they are placed under. For example, vias 208A, 208C, and 208E are placed under and coupled to bitline 204A while vias 208B and 208D are placed under and coupled to bitline 204B. Similarly, vias 210 (and negative wordline access points) are alternately placed under and coupled to bitline 206A and bitline 206B. Placing vias 208 and vias 210 directly under bitlines 204A, 204B and bitlines 206A, 206B may reduce connection distance between the vias and the bitlines in addition to providing contacts between the vias and bitlines that occupy less space in layout 300.

Different wordlines associated with bit cells 202 may be accessed by accessing the positive and negative bitlines at access points that correspond to each wordline available in layout 200 or layout 300 (shown in FIGS. 2 and 3, respectively). Logic used to coordinate access to the different wordlines according to the different positive and negative bitline access points may be built into column select logic (e.g., multiplexers) associated with layout 200 or layout 300. As used herein, in various embodiments the term "logic" refers to circuitry configured to perform the indicated function(s). In some embodiments, a word bar (such as word bar 824, shown in FIGS. 8, 10, 14, and 15) is placed in parallel to bitlines 204 to provide connection to wordlines in layout 200 or layout 300. FIGS. 4-7 depict top view representations of various embodiments that provide access to different wordlines in layout 300 using selected positive wordline access points (corresponding to vias 208) and selected negative wordline access points (corresponding to vias 210). In certain embodiments, the wordlines in layout 300 (or layout 200) are perpendicular to bitlines 204 (and a word bar in parallel with the bitlines). While the embodiments depicted in FIGS. 4-7 are presented for layout 300, it is to be understood that the access to wordlines depicted in FIGS. 4-7 may be implemented for other contemplated embodiments of a layout (e.g., layout 200 depicted in FIG. 2).

Figure 4:
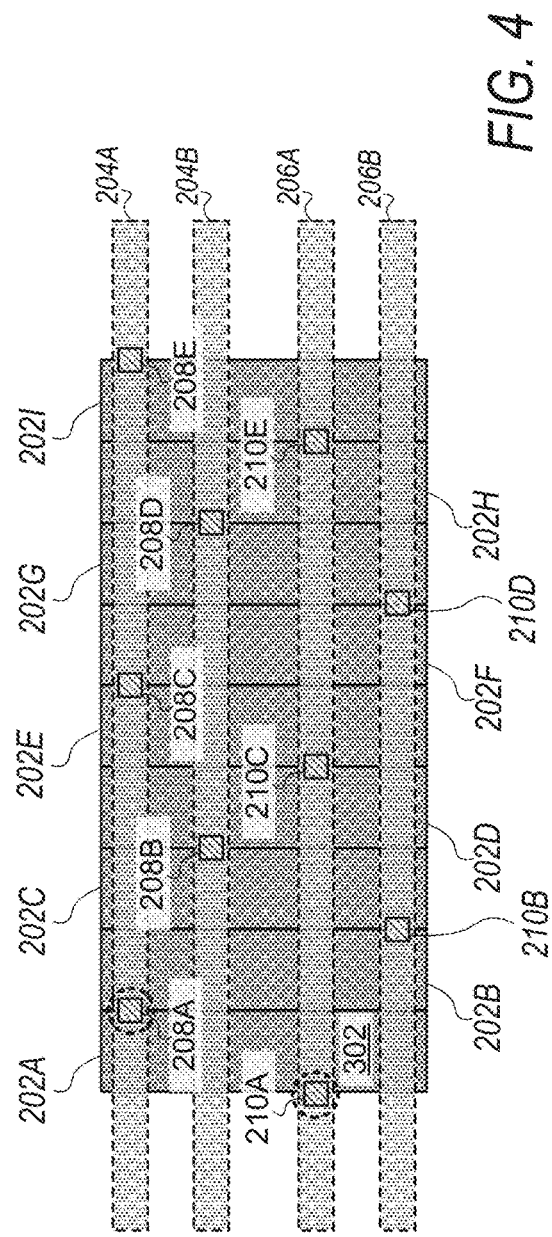
FIGS. 4-7 depict top view representations of various embodiments that provide access to different wordlines in a memory device layout.

FIG. 4 depicts a top view representation of an embodiment that provides access to wordline 302. Wordline 302 may be a wordline associated with bit cell 202A. In certain embodiments, wordline 302 is accessed by accessing bitline 204A using a positive bitline access point associated with via 208A and accessing bitline 206A using a negative bitline access point associated with via 210A (as shown by the dashed circles in FIG. 4).

Figure 5:
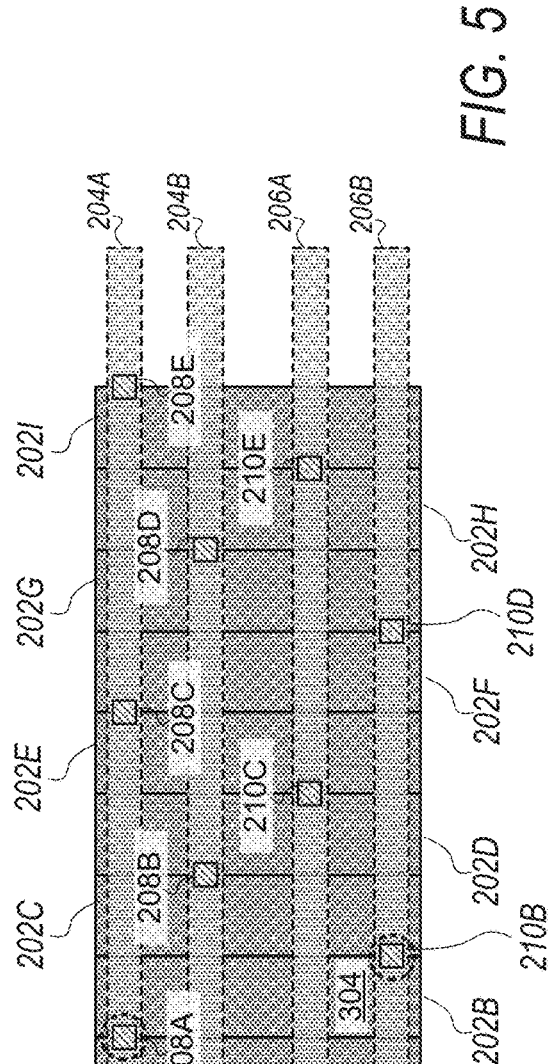

FIG. 5 depicts a top view representation of an embodiment that provides access to wordline 304. Wordline 304 may be a wordline associated with bit cell 202B. In certain embodiments, wordline 304 is accessed by accessing bitline 204A using a positive bitline access point associated with via 208A and accessing bitline 206B using a negative bitline access point associated with via 210B (as shown by the dashed circles in FIG. 5).

Figure 6:
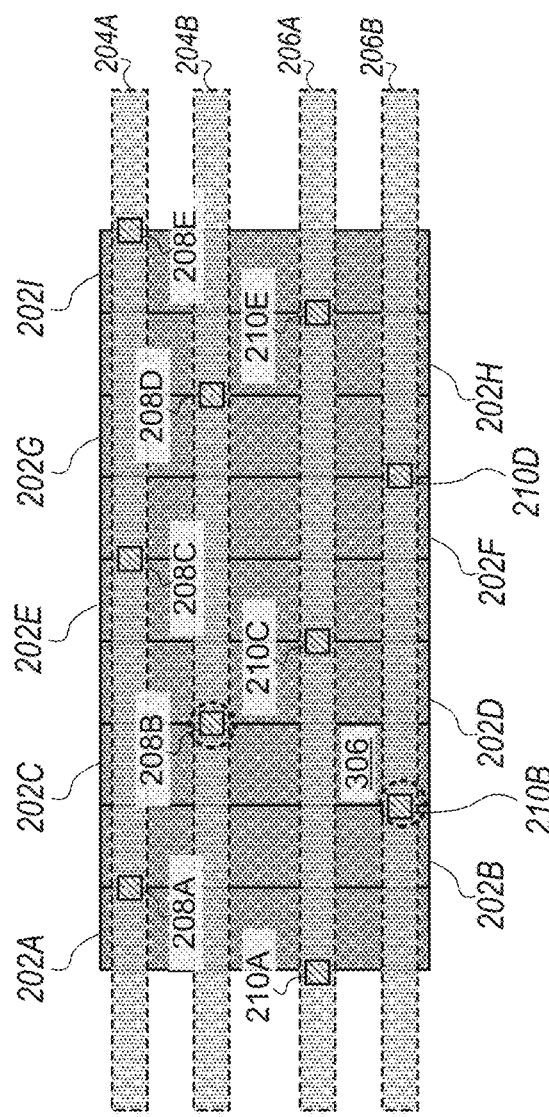

FIG. 6 depicts a top view representation of an embodiment that provides access to wordline 306. Wordline 306 may be a wordline associated with bit cell 202C. In certain embodiments, wordline 306 is accessed by accessing bitline 204B using a positive bitline access point associated with via 208B and accessing bitline 206B using a negative bitline access point associated with via 210B (as shown by the dashed circles in FIG. 6).

Figure 7:
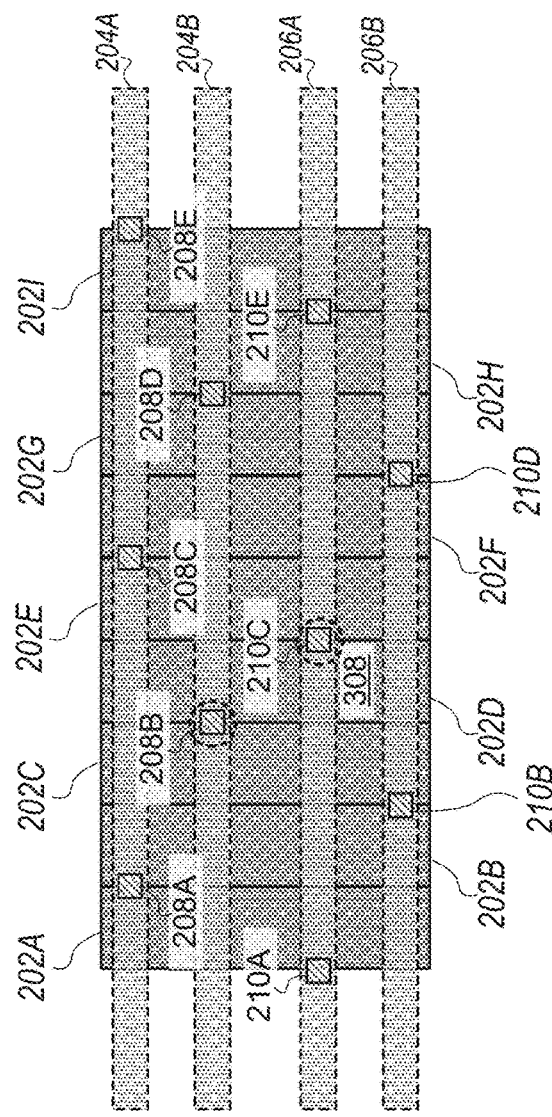

FIG. 7 depicts a top view representation of an embodiment that provides access to wordline 308. Wordline 308 may be a wordline associated with bit cell 202D. In certain embodiments, wordline 308 is accessed by accessing bitline 204B using a positive bitline access point associated with via 208B and accessing bitline 206A using a negative bitline access point associated with via 210C (as shown by the dashed circles in FIG. 7). Additional wordline accesses associated with additional bit cells (e.g., bit cells 202E-I) in layout 300 may continue with logic similar to logic applied for the wordline accesses depicted in FIGS. 4-7.

The embodiments of layout 200 and layout 300 (the memory array layouts depicted in FIGS. 2 and 3, respectively) provide layout and performance advantages over the conventional layout depicted in FIG. 1. For example, layout 200 and layout 300 implement dual pairs of bitlines (e.g., a pair of positive bitlines and a pair of negative bitlines). Dual pairs of bitlines may be possible due to the increased height of current memory cells caused by use of unidirectional poly in SRAM devices. Additionally, dual pairs of bitlines may be made possible by alternating via connections between bitlines in each pair and by applying column select logic for wordline access to the different bitline access points. With the dual pairs of bitlines, layout 200 and layout 300 improve bitline performance by doubling the number of bits stored within each column by implementing the dual pairs of bitlines. With two bits storable within each column, the wordline length needed to provide a select number of bits (e.g., 64 bits) in layout 200 or layout 300 is half the wordline length needed to provide the same number of bits in layout 100. For example, layout 200 or layout 300 only needs 32 columns to store 64 bits (with 2 bits per column) while layout 100 needs 64 columns to store 64 bits.

In addition, layout 200 and layout 300 implement the dual pairs of bitlines with alternating connections (vias) to the bitlines. Implementing the dual pairs of bitlines with alternating connections (vias) to the bitlines reduces (e.g., by about half) the bitline capacitance of memory devices using such layouts. Reducing the bitline capacitance reduces the RC delay in these memory devices, thereby improving performance of the memory devices and reducing power consumption by the memory devices. Thus, a memory device utilizing layout 200 or layout 300 may have a more square aspect ratio, which improves overall efficiency at the tile or SoC ("system-on-chip") level. Reducing the bitline capacitance may also assist in reducing the effects of resistance of lower level metals being implemented in memory devices.

With the reduced RC delay, layout 200 or layout 300 may have a wider width (e.g., more columns) than layout 100. For example, the embodiments of layout 200 and layout 300 include nine bit cells (bit cells 202A-I), the same width and number of bit cells as layout 100. Layout 200 or layout 300 may, however, have a greater number of bit cells and a wider width than layout 100 because of the reduced RC delay provided by layout 200 or layout 300. Having a greater number of bit cells may increase performance by increasing the bit storage capability of a memory device utilizing layout 200 or layout 300 while maintaining performance of the memory device (e.g., RC delay properties are within reasonable limits).

While FIGS. 2 and 3 depict two possible memory device layouts that include dual pairs of bitlines that span across multiple bit cells within a single column pitch, additional embodiments may also be contemplated. For example, a column pitch may possibly allow more than two pairs of bitlines (such as three pairs of bitlines). Additional embodiments may also be contemplated where the order of vias (and wordline access points) is varied differently while remaining within the scope of the current disclosure. For example, the alternating vias between a first bitline and a second bitline in a pair of bitlines may be flipped (e.g., vias 208A-E may be flipped in FIG. 3 with vias 208A, 208C, and 208E underlying bitline 204B and vias 208B and 208D underlying bitline 204A).

Figure 8:
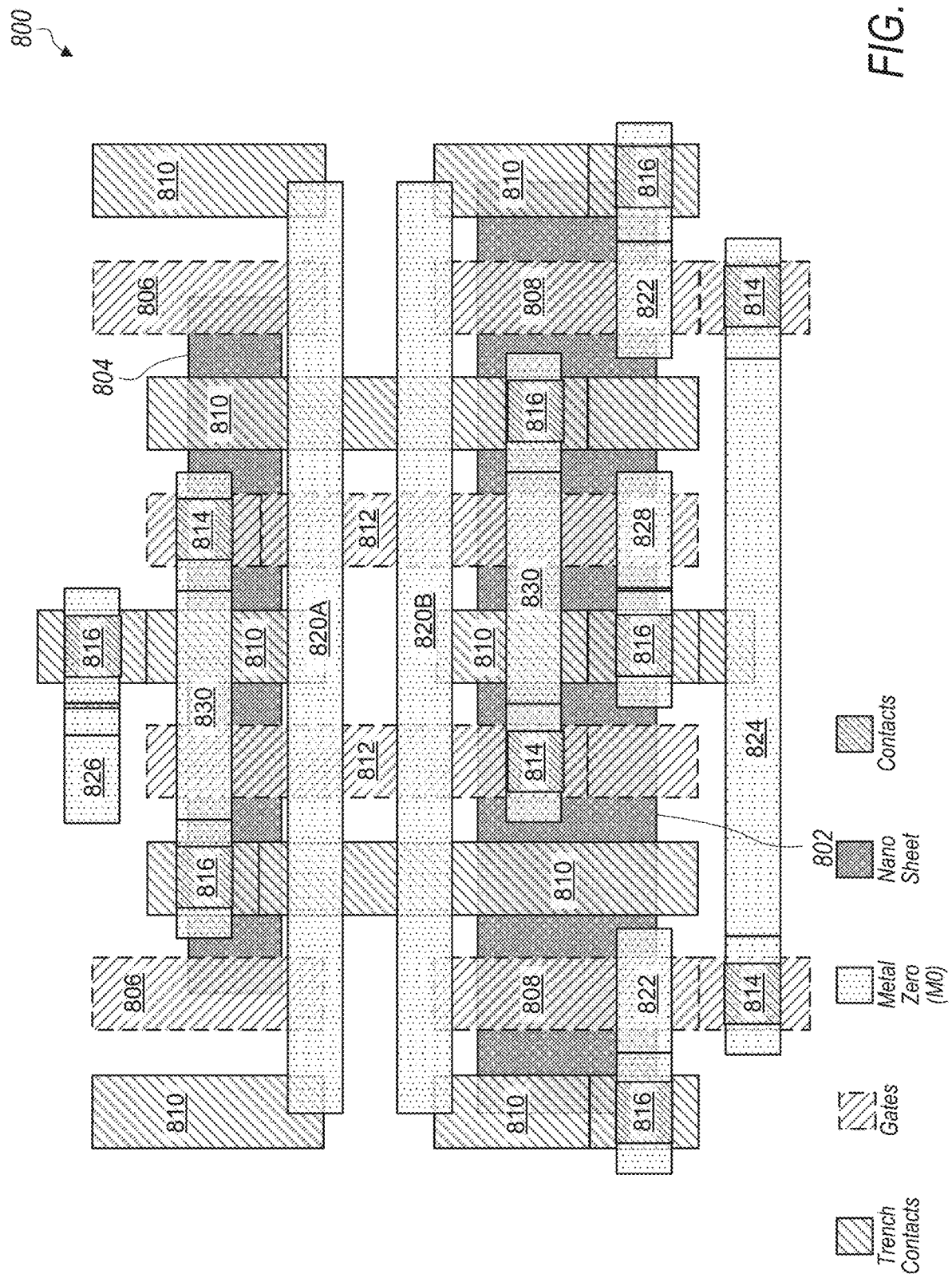
FIG. 8 depicts a top view representation of an embodiment of a metal zero (M0) layer built upon underlying poly layer(s) in a memory cell layout.
Figure 10:
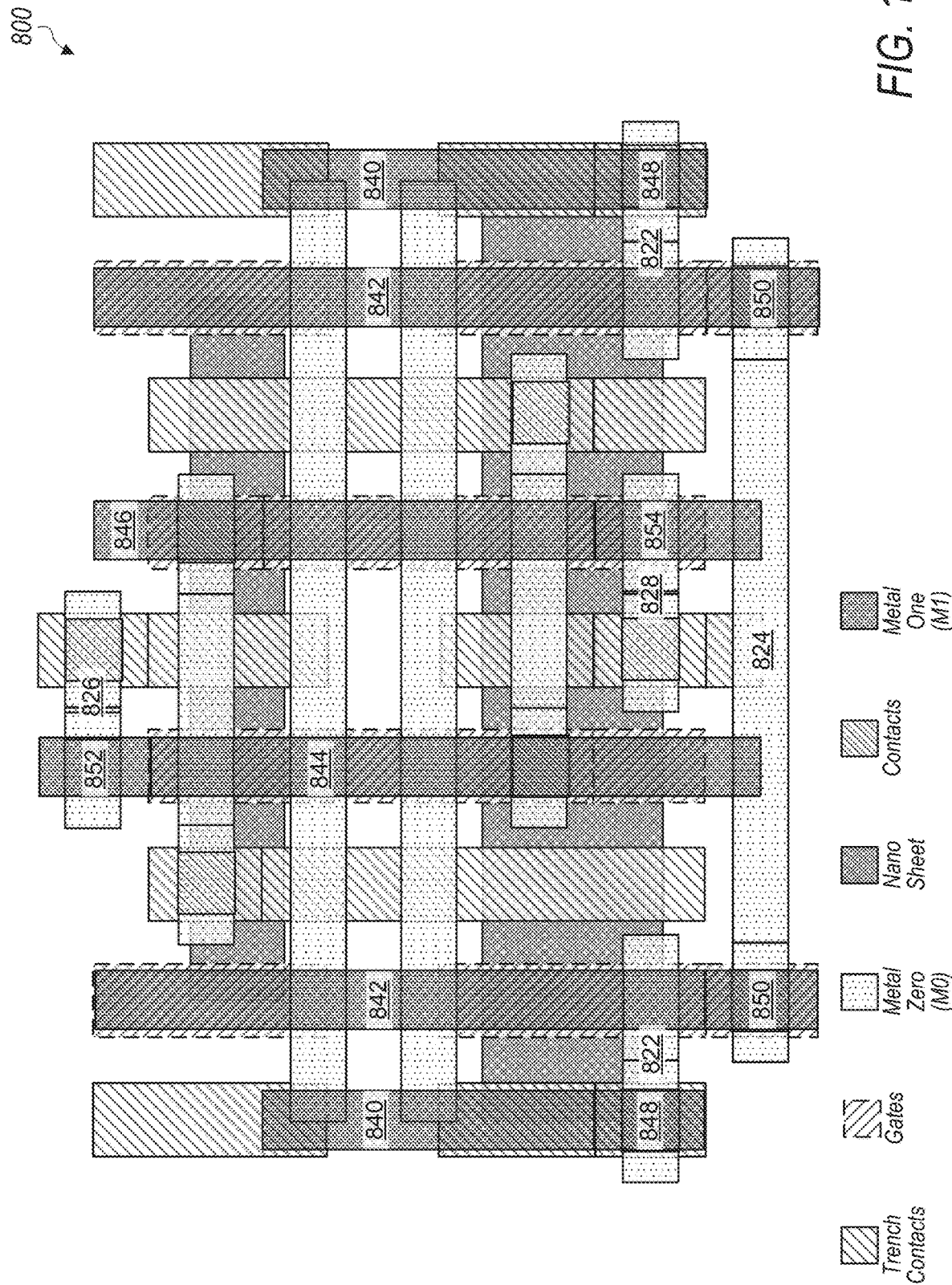
FIG. 10 depicts a top view representation of an embodiment of a metal one (M1) layer built upon the memory cell layout from FIG. 8.
Figure 11:
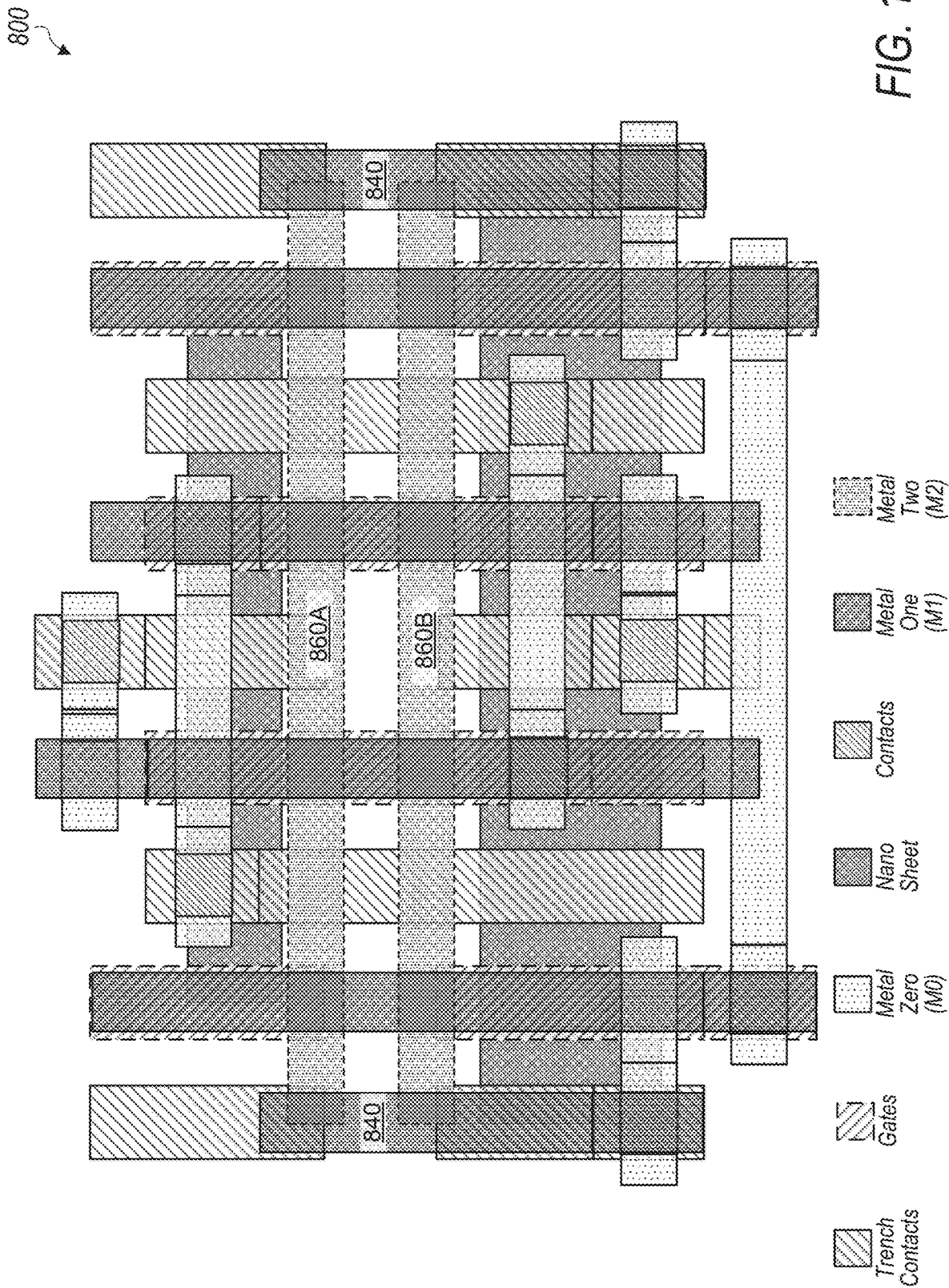
FIG. 11 depicts a top view representation of an embodiment of a metal two (M2) layer built upon the memory cell layout from FIGS. 8 and 10.
Figure 13:
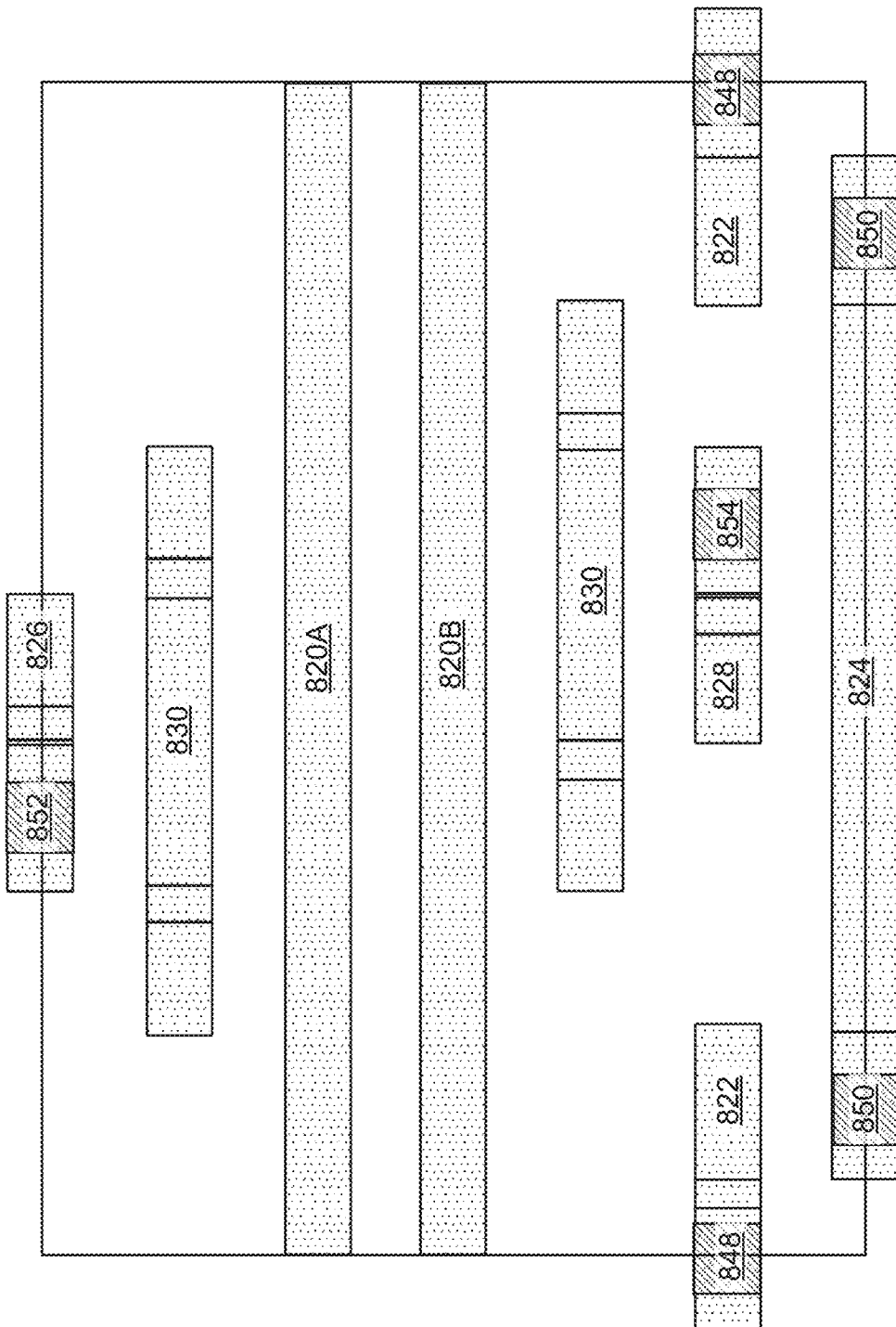
FIG. 13 depicts a top view representation of an embodiment of the M0 layer and the via zero (V0) layer.
Figure 14:
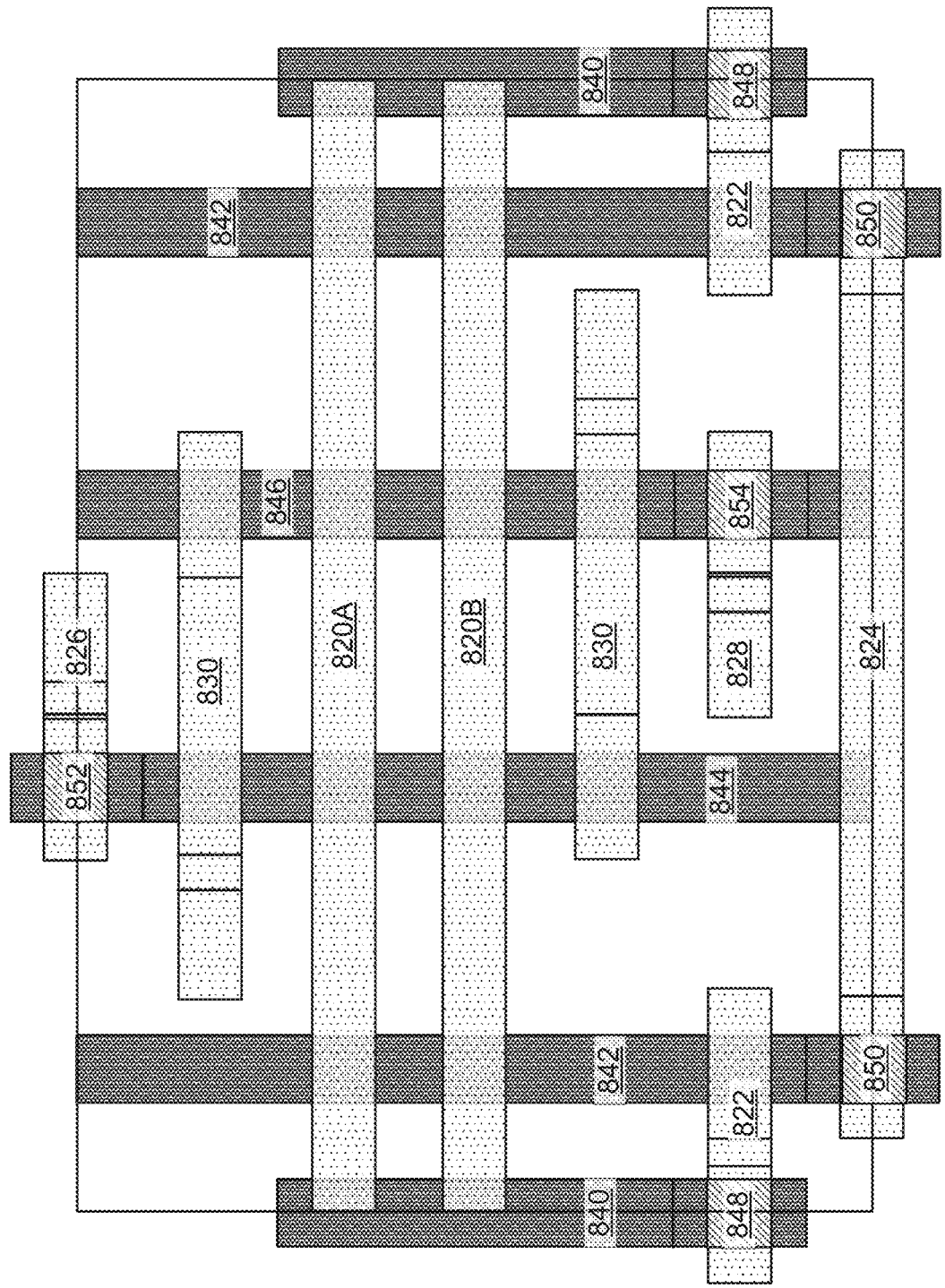
FIG. 14 depicts a top view representation of an embodiment of the M1 layer formed over the M0 layer and the V0 layer of FIG. 13.
Figure 15:
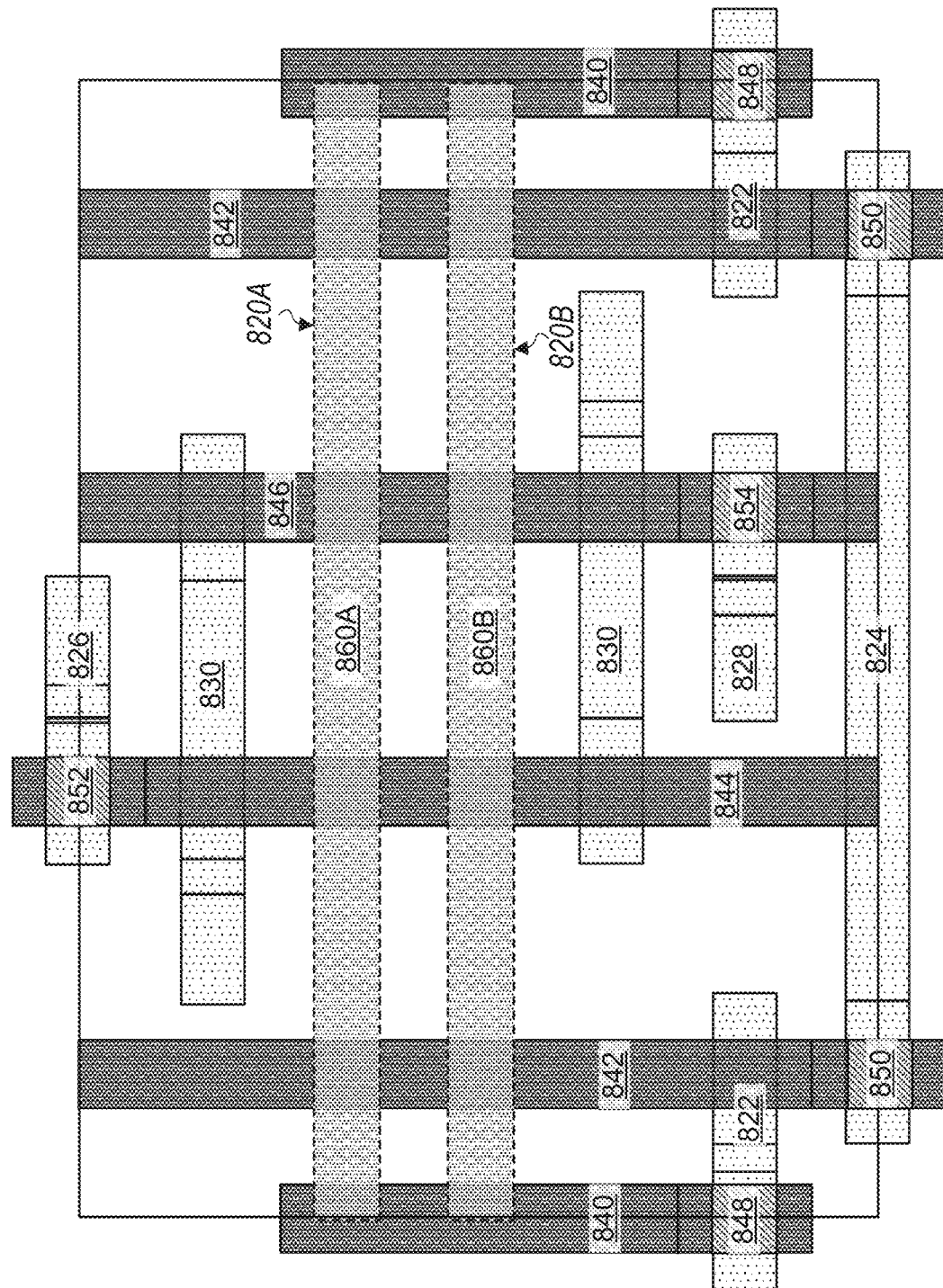
FIG. 15 depicts a top view representation of an embodiment of the M2 layer formed over the M1 layer of FIG. 14.

Layout 200 and layout 300, depicted in FIGS. 2 and 3, respectively, describe embodiments for increasing performance and utilization of resources in memory devices (e.g., memory arrays) over multiple bit cells (e.g., using dual pairs of bitlines spanning multiple bit cells). Embodiments may also be contemplated for improving performance and utilization of resources within the bit cells themselves. FIGS. 8, 10, and 11 depict top view representations of embodiments of the build-up of metal layers above underlying poly layer(s) in a layout of an embodiment of a bit cell (e.g., a SRAM cell) that provides improved performance over current bit cell layouts. It should be noted that FIGS. 13, 14, and 15, described herein, are provided as an additional depiction of the build-up of metal layers that corresponds to FIGS. 8, 10, and 11 but without depiction of the underlying poly layer(s). FIGS. 13, 14, and 15 may be used to aid in the understanding of the build-up of metal layers depicted and described in FIGS. 8, 10, and 11.

FIG. 8 depicts a top view representation of an embodiment of a metal zero (M0) layer built upon underlying poly layer(s) in a memory cell layout. Memory cell layout 800 is a layout for a single memory cell (e.g., bit cell). In certain embodiments, layout 800 is a layout for a 6T (six-transistor) SRAM cell. Layout 800 may be formed by taking the underlying poly layer(s) of a conventional bit (memory) cell with n-channel to p-channel to p-channel to n-channel laid out in the vertical direction (as depicted in the figures herein) inside the bit cell (which makes the bit cell taller than it is wide), cutting the bit cell in half horizontally between the two p-channels, rotating one of the halves 180°, and placing the two halves next to each other to form a single bit cell that is more square in aspect ratio (and, in some embodiments, has a substantially square aspect ratio) than the original bit cell and uses the same area as the original bit cell.

FIGS. 9A-D depict a top view conceptual representation of an embodiment showing the formation of the poly foundation of layout 800, as described above. The embodiment shown in FIGS. 9A-D is a representation of how an embodiment of underlying poly layer(s) for layout 800 may be conceptually restructured from a bit cell with n-channel to p-channel to p-channel to n-channel laid out in the vertical direction. It is to be understood that the conceptual representation shown in FIGS. 9A-D is representative of one possible scenario for depicting how the embodiment of the underlying poly layer for layout 800 may be formed and that other possible scenarios may also be contemplated.

Figure 9:
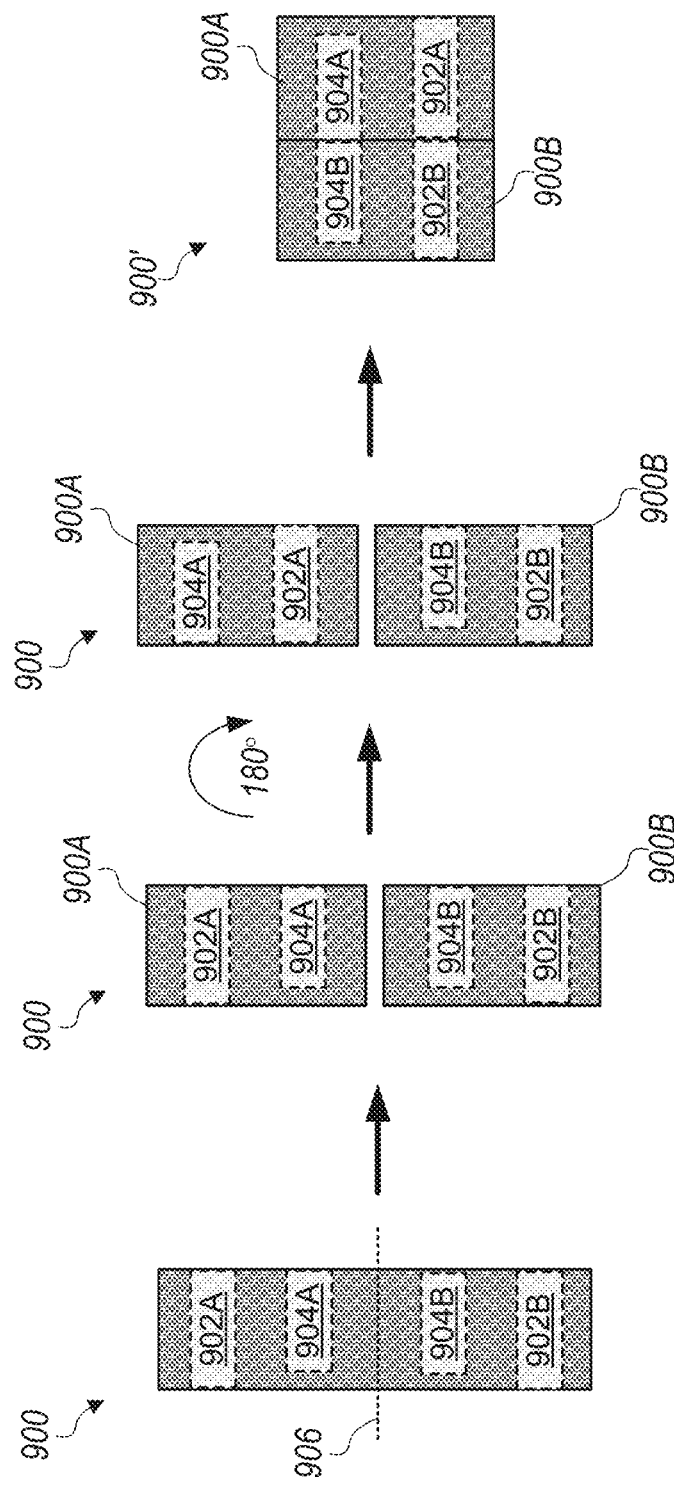
FIGS. 9A-D depict a top view conceptual representation of an embodiment showing the formation of a poly foundation of a layout.

In FIG. 9A, bit cell 900 is a bit (memory) cell with n-channel 902A, p-channel 904A, p-channel 904B, and n-channel 902B laid out in the vertical direction (as depicted in FIG. 9A) inside the bit cell. It is to be understood that additional features (such as gates, gate contacts, trench contacts, etc.) may also be located in the underlying poly layer(s) depicted in FIGS. 9A-D. For simplicity in FIGS. 9A-D, however, only n-channels 902A, 902B and p-channels 904A, 904B are shown in the poly layer(s).

As shown in FIG. 9A, bit cell 900 is cut in half horizontally between p-channel 904A and p-channel 904B along line 906 to form half bit cell 900A and half bit cell 900B, shown in FIG. 9B. After being cut in half, half bit cell 900A is rotated 180° such that p-channel 904A is vertically above n-channel 902A, as shown in FIG. 9C. After the rotation of half bit cell 900A, half bit cell 900A and half bit cell 900B may be placed next to each other to form bit cell 900', as shown in FIG. 9D. Half bit cell 900A and half bit cell 900B are placed next to each other such that n-channel 902A is horizontally aligned with n-channel 902B and p-channel 904A is horizontally aligned with p-channel 904B to provide continuous n-channel 902 and continuous p-channel 904 in bit cell 900'.

The layout of poly in bit cell 900' may be used as a restructured poly foundation (e.g., underlying poly layer(s)) for the build-up and generation of layout 800, as shown in FIGS. 8, 10, and 11. As shown in FIG. 9D, bit cell 900' is "folded over" from bit cell 900 and bit cell 900' has a more square aspect ratio (e.g., bit cell 900' has a substantially square aspect ratio) than bit cell 900 (shown in FIG. 9A) while both bit cells have the same area. Additionally, the poly layer(s) (including as gates, gate contacts, trench contacts, etc.) in both bit cells may be on the same scale. Generating the layout of poly in bit cell 900' provides additional room (e.g., additional routing space) inside the bit cell to add elements/features in layout 800, as described herein.

Turning back to FIG. 8, the underlying poly layer(s) in layout 800 includes n-channel 802 and p-channel 804. N-channel 802 and p-channel 804 may include, for example, nanosheet gate transistors. In certain embodiments, layout 800 includes gates 806, gates 808, trench contacts 810, gates 812, gate contacts 814, and contacts 816 in the underlying poly layer(s). Gates 806 may be, for example, p-channel termination gates (e.g., dummy gates). Gates 812 may be, for example, control gates (CG). Gate contacts 814 may be contacts between gates 808 or gates 812 and the M0 (metal 0) layer. Contacts 816 may be contacts between trench contacts 810 and the M0 layer.

In certain embodiments, the M0 layer is formed above the underlying poly layer(s) in layout 800 and includes bitlines 820, bit bars 822, word bar 824, Vdd (positive supply voltage) bar 826, Vss (ground voltage) bar 828, and bit cell cross couples 830. Bitlines 820 may include bitline 820A and bitline 820B. In some embodiments, bitline 820A and bitline 820B are a positive/negative pair of bitlines (e.g., one is positive, the other is negative). In some embodiments, both bitline 820A and bitline 820B are the same polarity bitlines (e.g., both positive or both negative). In such embodiments, the polarity of bitline 820A and bitline 820B are complementary to the polarity of bitline 860A and bitline 860B, shown in FIG. 11. As shown in FIG. 8, dual bitlines 820 may be placed in layout 800 with the additional routing space provided by the restructuring of the underlying poly layer(s) (as shown in FIG. 9D).

Word bar 824 may be coupled to gates 808 using gate contacts 814. Vdd bar 826 and Vss bar 828 may be coupled to trench contacts 810 by contacts 816. Bit cell cross couples 830 may be coupled to gates 812 by contacts 814 and to trench contacts 810 by contacts 816. In certain embodiments, bit cell cross couples 830 provide connection for logic between the two "halves" of layout 800 (e.g., the two halves of a memory cell layout, as shown in FIG. 9D). Bit cell cross couples 830 may allow normal logic constructions to be used for a memory cell using layout 800.

FIG. 10 depicts a top view representation of an embodiment of a metal one (M1) layer built upon memory cell layout 800 from FIG. 8. For simplicity in FIG. 10, not all elements from FIG. 8 are labelled in the depiction of FIG. 10. In certain embodiments, the M1 layer in layout 800 includes bit bars 840, wordlines 842, Vdd bar 844, and Vss bar 846. Contact between bit bars 840 and bit bars 822 (in M0) may be made through a via zero (V0) layer using via contacts 848. In addition, bit bars 840 are extended to overlap bitlines 820 in the M0 layer (and also overlap bitlines 860 in the M2 layer, as described below). Overlapping between bit bars 840 and bitlines 820 (and bitlines 860) may allow via contact to be made between the bits bars and the bitlines. Contact between wordlines 842 and word bar 824 (in M0) may be made through the V0 layer using via contacts 850 (e.g., via pads). Contact between Vdd bar 844 and Vdd bar 826 (in M0) may be made through the V0 layer using via contact 852. Contact between Vss bar 846 and Vss bar 828 (in M0) may be made through the V0 layer using via contact 854.

In certain embodiments, as shown in FIG. 10, layout 800 includes two vertical wordlines 842 in the M1 layer. Dual vertical wordlines 842 may be placed in layout 800 with the additional space provided by the restructuring of the underlying poly layer(s) (as shown in FIG. 9D). Dual wordlines 842 may reduce the overall resistance of the path for wordline access in layout 800 as well as providing redundant wordline paths in the layout. In addition, wordlines 842 are half the length of wordlines in a conventional 6T SRAM cell (e.g., bit cell 900, shown in FIG. 9A). Thus, layout 800 reduces resistance and RC delay in wordlines 842 by both reducing the length of the wordlines and by doubling the number of wordlines, which improves performance of a memory cell implementing layout 800. In some embodiments, additional vertical wordlines 842 may be placed in layout 800 to further reduce RC delay and resistance in the wordlines. For example, two additional vertical wordlines 842 may be placed in layout 800.

FIG. 11 depicts a top view representation of an embodiment of a metal two (M2) layer built upon memory cell layout 800 from FIGS. 8 and 10. For simplicity in FIG. 11, not all elements from FIGS. 8 and 10 are labelled in the depiction of FIG. 11. The M2 layer in layout 800 includes bitlines 860. In certain embodiments, bitlines 860 includes dual bitlines, bitline 860A and bitline 860B. Bitline 860A and bitline 860B in the M2 layer may substantially overlap (e.g., lie substantially directly above) bitline 820A and bitline 820B, respectively, in the M0 layer. Thus, bitlines 860 in the M2 layer are vertically parallel to bitlines 820 in the M0 layer.

In certain embodiments, the polarity of bitline 860A and bitline 860B are complementary to the polarity of bitline 820A and bitline 820B. For example, bitline 860A and bitline 860B may be a positive/negative pair of bitlines that are complementary to bitline 820A and bitline 820B, which are also a positive/negative pair of bitlines. Having bitlines 820 and bitlines 860 in separate layers allows the bitlines to function as dual pairs of bitlines similar to the embodiments depicted in FIGS. 1-7.

With bitlines 860 in the M2 layer and bitlines 820 in the M0 layer, bitlines are positioned both above and below bit bars 840 in the M1 layer, as shown in FIGS. 10 and 11. Vertical contacts may be made from bit bars 840 in the M1 layer to either bitlines 820 (by going down through the V0 layer to M0 using via contacts) or bitlines 860 (by going up to M2 through a via one (V1) layer using via contacts). Going down to bitlines 820 in M0 or up to bitlines 860 in M2 from bit bars 840 in M1 allows connections (e.g., wordline access points) varied between different bit cells implemented with layout 800. For example, adjacent bit cells having layout 800 may alternate connections to bitlines 820 in M0 and bitlines 860 in M2 (e.g., bit cells connected to bitlines 820 in M0 alternate with bit cells connected to bitlines 860 in M2).

Figure 12:
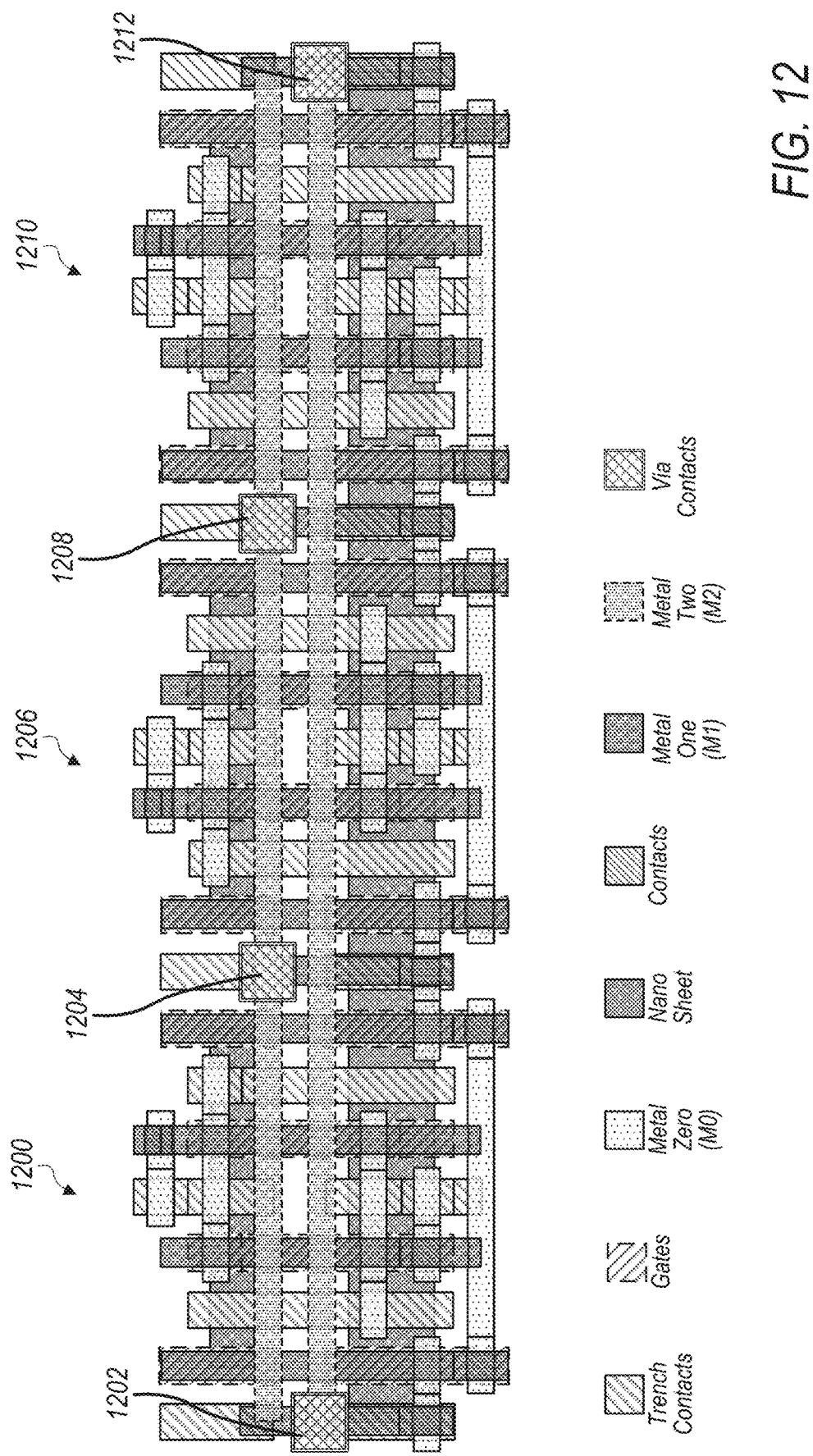
FIG. 12 depicts a top view representation of an embodiment of a memory cell array with three memory cells implementing a layout.

FIG. 12 depicts a top view representation of an embodiment of a memory cell array with three memory cells implementing layout 800. For simplicity in FIG. 12, not all elements from FIGS. 8, 10, and 11 are labelled in the depiction of FIG. 12. As shown in FIG. 12, first memory cell 1200 is implemented with layout 800 between via contact 1202 and via contact 1204. Via contact 1202 and via contact 1204 may provide contact between bit bars 840 in the M1 layer and bitlines 820 in the M0 layer. Second memory cell 1206 is implemented with layout 800 between via contact 1204 and via contact 1208. Via contact 1208 may provide contact between bit bars 840 in the M1 layer and bitlines 860 in the M2 layer. In some embodiments, second memory cell 1206 is a mirror image of first memory Third memory cell 1210 is implemented with layout 800 between via contact 1208 and via contact 1212. Via contact 1212 may provide contact between bit bars 840 in the M1 layer and bitlines 860 in the M2 layer. In some embodiments, second memory cell 1206 is a mirror image of first memory cell 1200 and third memory cell 1210. Alternating the connections to M0 and M2, in combination with the bitlines functioning as dual pairs of bitlines (described above), may provide reduced RC delay and reduced resistance advantages similar to the advantages for the embodiments of dual bitlines described in FIGS. 1-7.

Utilizing dual bitlines in layout 800, as shown in FIGS. 8 and 10-12, may also compensate for increased resistance in the bitlines caused by lengthening of the bitlines based on the restructuring of the bit cell that widens the bit cell (as shown in FIGS. 9A-D). While dual bitlines are shown in FIGS. 8 and 10-12, embodiments of layout 800 may also be contemplated where only a single bitline in the M0 layer and a single bitline in the M2 layer are implemented. Additionally, embodiments of layout 800 may be contemplated where dual bitlines are only located in either the M0 layer or the M2 layer.

As described herein, layout 800, depicted in FIGS. 8 and 10-12, describes an embodiment for improving performance and utilization of resources within a memory cell. These improvements may also provide better performance and utilization of resources in a memory device (e.g., a memory array) that incorporates multiple memory cells with layout 800. Using layout 800 in a memory device (e.g., a memory array) may improve performance of the memory device by reducing wordline resistance and RC delay in the memory device. Layout 800 may provide reduced wordline resistance and reduced RC delay by restructuring a conventional 6T SRAM cell and, using the same area, providing increased space for routing within the memory cell.

FIGS. 13-15 depict top view representations of embodiments of the build-up of metal layers for layout 800. FIGS. 13, 14, and 15 are similar to FIGS. 8, 10, and 11, respectively, with FIGS. 13, 14, and 15 depicting the build-up of metal layers for layout 800 without the underlying poly layer(s) shown in the figures (e.g., without n-channel, p-channel, gates, contacts, trench contacts, or gate contacts shown in the figures). Thus, FIGS. 13, 14, and 15 are shown to simplify the depiction of the build-up of metal layers in layout 800 to aid in the understanding of FIGS. 8, 10, and 11.

FIG. 13 depicts a top view representation of an embodiment of the M0 layer and the via zero (V0) layer. As shown in FIG. 13 and described herein, the M0 layer in layout 800 includes bitline 820A, bitline 820B, bit bars 822, word bar 824, Vdd bar 826, Vss bar 828, and bit cell cross couples 830. The V0 layer is used to couple between the M0 layer and the M1 layer. Contacts 848, 850, 852, and 854 may be formed in the V0 layer. Contacts 848 are coupled to bit bars 822. Contacts 850 are coupled to word bar 824. Contact 852 is coupled to Vdd bar 826. Contact 854 is coupled to Vss bar 828.

FIG. 14 depicts a top view representation of an embodiment of the M1 layer formed over the M0 layer and the V0 layer of FIG. 13. The M1 layer in layout 800, as described herein, includes bit bars 840, wordlines 842, Vdd bar 844, and Vss bar 846. Bit bars 840 are coupled to bit bars 822 by contacts 848. Wordlines 842 are coupled to word bar 824 by contacts 850. Vdd bar 844 is coupled to Vdd bar 826 by contact 852. Vss bar 846 is coupled to Vss bar 828 by contact 854.

FIG. 15 depicts a top view representation of an embodiment of the M2 layer formed over the M1 layer of FIG. 14. As described herein, the M2 layer of layout 800 includes bitline 860A and bitline 860B, which overlay bitline 820A and bitline 820B, respectively. In certain embodiments, the M2 layer is formed over a via one (V1) layer that is between the M1 layer and the M2 layer.

Figure 16:
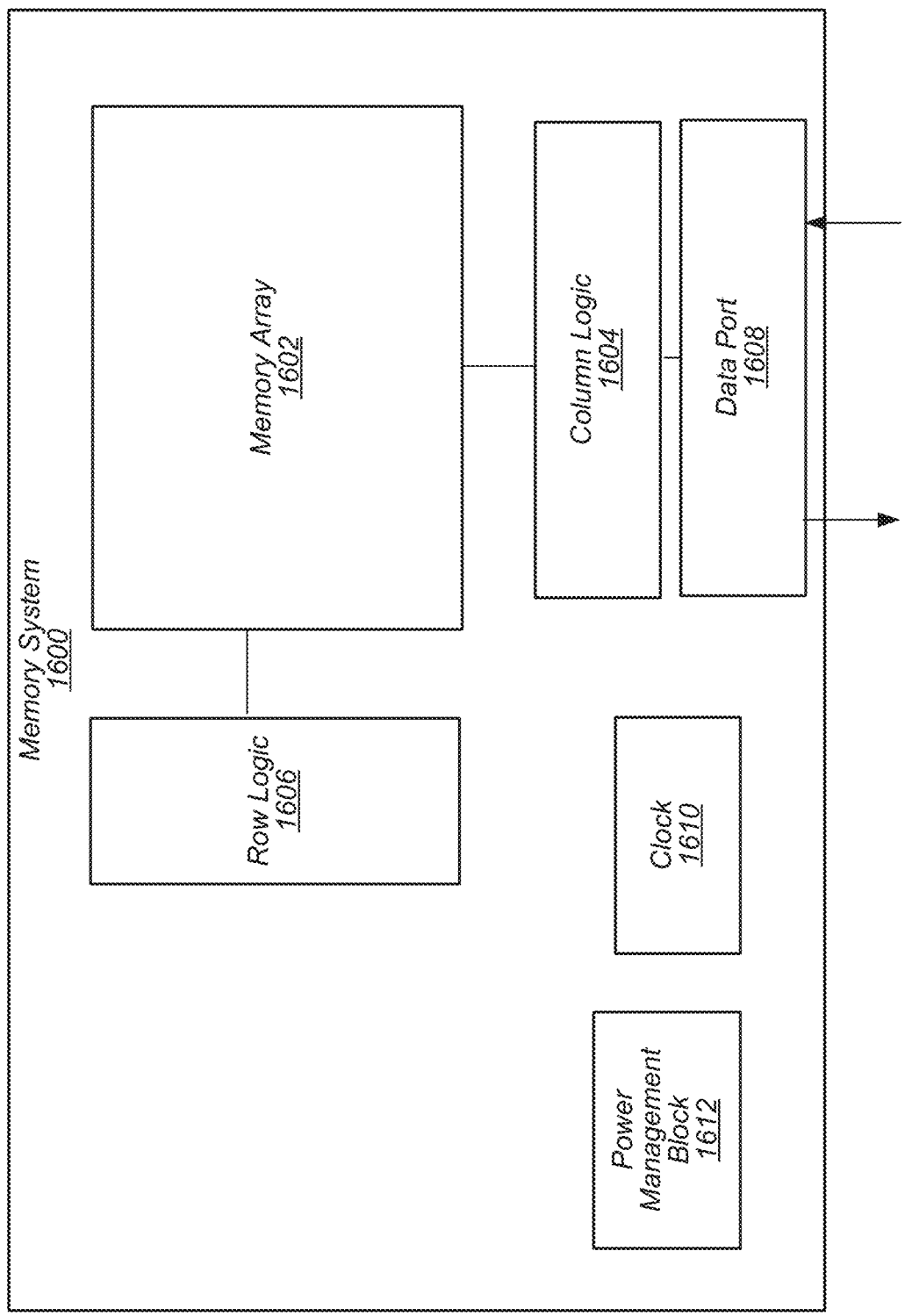
FIG. 16 depicts a block diagram representation of an embodiment of a memory system.

In certain embodiments, one or more of the integrated circuit layouts (e.g., memory array layouts or memory cell layouts) described herein is implemented in a memory system (e.g., a memory chip). For example, layout 200, shown in FIG. 2, layout 300, shown in FIG. 3, or layout 800, shown in FIGS. 8 and 10-12, may be implemented in memory system 1600, shown in FIG. 16. FIG. 16 depicts a block diagram representation of an embodiment of memory system 1600. Memory system 1600 may be a memory chip or other memory device that is utilized in an integrated circuit device.

In certain embodiments, memory system 1600 includes memory array 1602. Memory array 1602 may include memory arrays implementing layout 200 or layout 300 and/or memory cells implementing layout 800. Memory array 1602 may include a single memory array or a plurality of memory arrays.

As shown in FIG. 16, in some embodiments memory system 1600 includes control logic. For example, in the illustrated embodiment the control logic includes column logic 1604, row logic 1606, data port 1608, clock 1610, and power management block 1612. Column logic 1604 may include, for example, column select logic or column decoder logic. In some embodiments, column logic 1604 includes one or more multiplexers. Row logic 1606 may include row decoder logic. Data port 1608 may include logic or devices to allow read/write operations for memory array 1602. In some embodiments, data port 1608 includes a write driver for controlling write operations and a sense amplifier for controlling read operations.

Clock 1610 may include clock circuitry or be coupled to clock circuitry external to memory system 1600. Clock 1610 may control the timing of read/write operations for memory array 1602. Power management block 1612 may include circuitry for controlling power supplied to memory array 1602. In some embodiments, power management block 1612 interfaces with an external power source (e.g., a power source located on a power management integrated circuit).

In certain embodiments, one or more of the integrated circuit layouts described herein may be designed and/or implement using one or more processors (e.g., a computer processor) executing instructions stored on a non-transitory computer-readable medium. For example, layout 200, shown in FIG. 2, layout 300, shown in FIG. 3, or layout 800, shown in FIGS. 8 and 10-12, may be designed and/or implemented using one or more steps performed by one or more processors executing instructions stored as program instructions in a computer readable storage medium (e.g., a non-transitory computer readable storage medium).

Various portions of layout 200, layout 300, or layout 800 may be designed and/or implemented by various electronic design automation (EDA) tools or computer aided design (CAD) tools. Examples of such EDA or CAD tools include Synopsys' Design Compiler® or Cadence's Encounter® RTL Compiler, Synopsis' IC Compiler, and others. These EDA or CAD tools may include one or more modules of computer program instructions that, when executed by a computer processor, cause the processor to generate an integrated circuit layout such as layout 300 and, more specifically, generate one or more files for use in fabrication of the integrated circuit.

Figure 17:
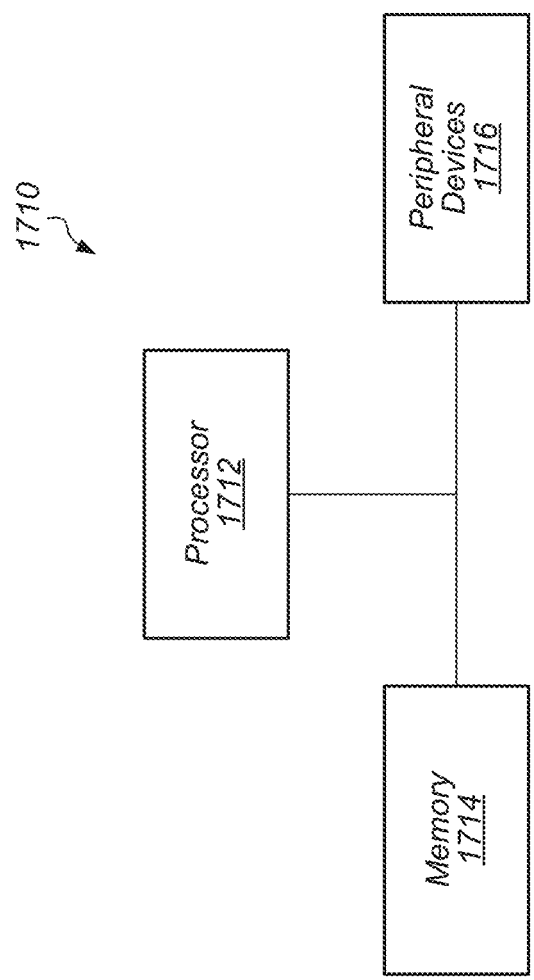
FIG. 17 depicts a block diagram of one embodiment of an exemplary computer system.

FIG. 17 depicts a block diagram of one embodiment of exemplary computer system 1710. Exemplary computer system 1710 may be used to implement one or more embodiments described herein. In some embodiments, computer system 1710 is operable by a user to implement one or more embodiments described herein such as layout 200, layout 300, or layout 800. In the embodiment of FIG. 17, computer system 1710 includes processor 1712, memory 1714, and various peripheral devices 1716. Processor 1712 is coupled to memory 1714 and peripheral devices 1716. Processor 1712 is configured to execute instructions, including the instructions for layout 200, layout 300, or layout 800, which may be in software. In various embodiments, processor 1712 may implement any desired instruction set. In some embodiments, computer system 1712 may include more than one processor. Moreover, processor 1712 may include one or more processors or one or more processor cores.

Processor 1712 may be coupled to memory 1714 and peripheral devices 1716 in any desired fashion. For example, in some embodiments, processor 1712 may be coupled to memory 1714 and/or peripheral devices 1716 via various interconnect. Alternatively or in addition, one or more bridge chips may be used to coupled processor 1712, memory 1714, and peripheral devices 1716.

Memory 1714 may comprise any type of memory system. For example, memory 1714 may comprise DRAM, and more particularly double data rate (DDR) SDRAM, RDRAM, etc. A memory controller may be included to interface to memory 1714, and/or processor 1712 may include a memory controller. Memory 1714 may store the instructions to be executed by processor 1712 during use, data to be operated upon by the processor during use, etc.

Peripheral devices 1716 may represent any sort of hardware devices that may be included in computer system 1710 or coupled thereto (e.g., storage devices, optionally including computer accessible storage medium 1700, shown in FIG. 17, other input/output (I/O) devices such as video hardware, audio hardware, user interface devices, networking hardware, etc.).

Figure 18:
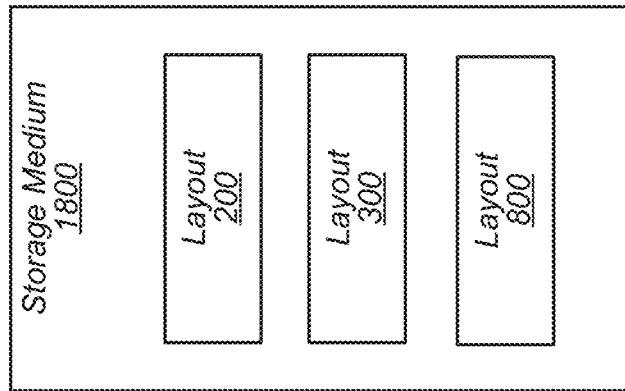
FIG. 18 depicts a block diagram of one embodiment of a computer accessible storage medium.

Turning now to FIG. 18, a block diagram of one embodiment of computer accessible storage medium 1800 including one or more data structures representative of layout 200, layout 300, or layout 800 included in an integrated circuit design and one or more code sequences representative of a process to form layout 200, layout 300, or layout 800. Each code sequence may include one or more instructions, which when executed by a processor in a computer, implement the operations described for the corresponding code sequence. Generally speaking, a computer accessible storage medium may include any storage media accessible by a computer during use to provide instructions and/or data to the computer. For example, a computer accessible storage medium may include non-transitory storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, computer accessible storage medium 500 may store data in a non-transitory manner, where non-transitory in this context may refer to not transmitting the instructions/data on a signal. For example, non-transitory storage may be volatile (and may lose the stored instructions/data in response to a power down) or non-volatile.

Generally, the database of layout 200, layout 300, or layout 800 carried on the computer accessible storage medium 1800 may be a database which can be read by a program and used, directly or indirectly, to fabricate the hardware comprising layout 200, layout 300, or layout 800. For example, the database may be a behavioral-level description or register-transfer level (RTL) description of the hardware functionality in a high level design language (HDL) such as Verilog or VHDL. The description may be read by a synthesis tool which may synthesize the description to produce a netlist of an integrated circuit for use in integrated circuit layout generation. The netlist may then be placed and routed to produce a data set describing geometric shapes to be applied to masks. The masks may then be used in various semiconductor fabrication steps to produce a semiconductor circuit or circuits corresponding to layout 200, layout 300, or layout 800. Alternatively, the database on the computer accessible storage medium 1800 may be the netlist (with or without a synthesis library) or the data set, as desired.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed:

1. An integrated circuit layout, comprising:
a plurality of bit cells positioned as adjacent columns;
a first pair of bitlines spanning the bit cells, each of the first pair of bitlines being a positive bitline providing access to a respective one of two bits of data stored in a given bit cell of the plurality of bit cells; and
a second pair of bitlines spanning the bit cells, each of the second pair of bitlines being a negative bitline providing access to a respective one of the two bits of data stored in the given bit cell of the plurality of bit cells; and
wherein the first pair of bitlines and the second pair of bitlines alternate connections to adjacent bit cells.

2. The integrated circuit layout of claim 1, wherein the second pair of bitlines are complementary to the first pair of bitlines.

3. The integrated circuit layout of claim 1, wherein a first bitline and a second bitline in the first pair of bitlines alternate connections between consecutive pairs of adjacent bit cells, and wherein a first bitline and a second bitline in the second pair of bitlines alternate connections between consecutive pairs of adjacent bit cells.

4. The integrated circuit layout of claim 1, further comprising a first set of vias coupled to the first pair of bitlines to provide connections to the bit cells and a second set of vias coupled to the second pair of bitlines to provide connections to the bit cells.

5. The integrated circuit layout of claim 4, wherein the first set of vias are positioned between the first pair of bitlines, and wherein the second set of vias are positioned between the second pair of bitlines.

6. The integrated circuit layout of claim 4, wherein the first set of vias are positioned along the first pair of bitlines, and wherein the second set of vias are positioned along the second pair of bitlines.

7. The integrated circuit layout of claim 1, wherein alternate connections to adjacent bit cells are positioned at interfaces between the bit cells.

8. The integrated circuit layout of claim 1, wherein the bit cells have column heights greater than column widths.

9. The integrated circuit layout of claim 1, wherein the second pair of bitlines are parallel to the first pair of bitlines.

10. The integrated circuit layout of claim 1, wherein alternate connections to adjacent bit cells provide access points for wordlines in the integrated circuit layout.

11. The integrated circuit layout of claim 1, wherein the given bit cell comprises two wordlines, each for accessing a respective one of the two bits of data stored in the given bit cell.

12. A system, comprising:
a memory array, the memory array including:
a plurality of bit cells positioned as adjacent columns;
a first pair of bitlines spanning the bit cells, each of the first pair of bitlines being a positive bitline providing access to a respective one of two bits of data stored in a given bit cell of the plurality of bit cells; and
a second pair of bitlines spanning the bit cells, each of the second pair of bitlines being a negative bitline providing access to a respective one of the two bits of data stored in the given bit cell of the plurality of bit cells; and
wherein the first pair of bitlines and the second pair of bitlines alternate connections to adjacent bit cells; and
control logic coupled to the memory array.

13. The system of claim 12, wherein the control logic includes row logic and column logic.

14. The system of claim 12, wherein row logic includes a row decoder and column logic includes a multiplexer.

15. The system of claim 12, further comprising a data port that includes a write driver and a sense amplifier coupled to the memory array.

16. The system of claim 12, further comprising a clock coupled to the memory array.

17. A memory device, comprising:
a plurality of bit cells positioned as adjacent columns;
a first pair of bitlines spanning the bit cells, each of the first pair of bitlines being a positive bitline providing access to a respective one of two bits of data stored in a given bit cell of the plurality of bit cells; and
a second pair of bitlines spanning the bit cells, each of the second pair of bitlines being a negative bitline providing access to a respective one of the two bits of data stored in the given bit cell of the plurality of bit cells;
wherein the first pair of bitlines and the second pair of bitlines alternate connections to adjacent bit cells.

18. The memory device of claim 17, wherein the second pair of bitlines are complementary to the first pair of bitlines, and wherein a first bitline and a second bitline in the first pair of bitlines alternate connections between consecutive pairs of adjacent bit cells, and wherein a first bitline and a second bitline in the second pair of bitlines alternate connections between consecutive pairs of adjacent bit cells.

19. The memory device of claim 17, wherein the bit cells are aligned in a first direction, the bit cells having column heights in a second direction greater than column widths of the bit cells in the first direction.

20. The memory device of claim 17, wherein the memory device is a SRAM device.

* * * * *